US012568658B2

(12) United States Patent
Li et al.

(10) Patent No.: US 12,568,658 B2
(45) Date of Patent: Mar. 3, 2026

(54) TECHNOLOGIES FOR MAJORITY GATES

(71) Applicant: Intel Corporation, Santa Clara, CA (US)

(72) Inventors: Hai Li, Portland, OR (US); Ian Alexander Young, Olympia, WA (US); Dmitri Evgenievich Nikonov, Beaverton, OR (US); Julien Sebot, Portland, OR (US); Raseong Kim, Portland, OR (US); Chia-Ching Lin, Portland, OR (US); Punyashloka Debashis, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 17/711,665

(22) Filed: Apr. 1, 2022

(65) Prior Publication Data

US 2023/0317847 A1 Oct. 5, 2023

(51) Int. Cl.
H10D 30/69 (2025.01)
H10N 50/85 (2023.01)

(52) U.S. Cl.
CPC ........... H10D 30/701 (2025.01); H10N 50/85 (2023.02)

(58) Field of Classification Search
CPC ...... H10D 30/701; H10D 1/682; H10D 1/692; H10N 50/85; H10N 59/00; H03K 19/23
See application file for complete search history.

(56) References Cited

U.S. PATENT DOCUMENTS

2019/0386662 A1 12/2019 Lin et al.
2020/0091414 A1* 3/2020 Liu ..................... G11C 11/1675
2020/0211608 A1 7/2020 Manipatruni et al.

FOREIGN PATENT DOCUMENTS

CN 111158635 B 11/2021

OTHER PUBLICATIONS

USPTO; U.S. Appl. No. 18/622,832, filed Mar. 29, 2024; 60 pages.
Li, Hai, et al., "Differential Electrically Insulated Magnetoelectric Spin-Orbit Logic Circuits," IEEE Journal on Exploratory Solid-State Computational Devices and Circuits, vol. 7, No. 1, Jun. 2021, pp. 18-25; Intel Corporation; Hillsboro, Oregon; 8 pages.
Manipatruni, Sasikanth, et al., "Scalable energy-efficient magnetoelectric spin-orbit logic, " Springer Nature Limited, 2018; 9 pages.
Manipatruni, Sasikanth, et al., "Scalable energy-efficient magnetoelectric spin-orbit logic," Supplementary Information—Springer Nature Limited, 2018; 50 pages.

* cited by examiner

*Primary Examiner* — Mohammad A Rahman
(74) *Attorney, Agent, or Firm* — Alliance IP, LLC

(57) ABSTRACT

Technologies for majority gates are disclosed. In one embodiment, a ferroelectric layer has three inputs and an output adjacent a surface of the ferroelectric. When a voltage is applied to each input, the inputs and a ground plane below the ferroelectric layer form a capacitor. The ferroelectric layer becomes polarized based on the applied voltages at the inputs. The portion of the ferroelectric layer near the output becomes polarized in the direction of polarization of the majority of the inputs. The output voltage then reflects the majority voltage of the inputs.

23 Claims, 16 Drawing Sheets

814

816

808

806

706

802A

802B

802C

704

824

822

820

810

812

816

824

806

808

814

1302

1304

702

1400

1402

1402

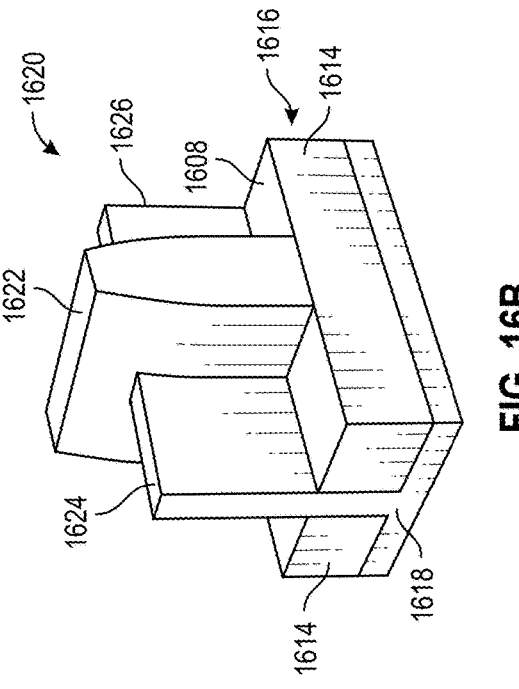
FIG. 16A
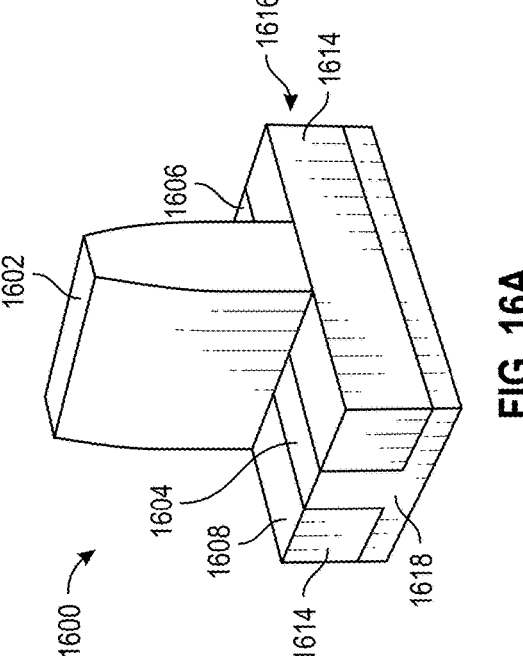
FIG. 16B
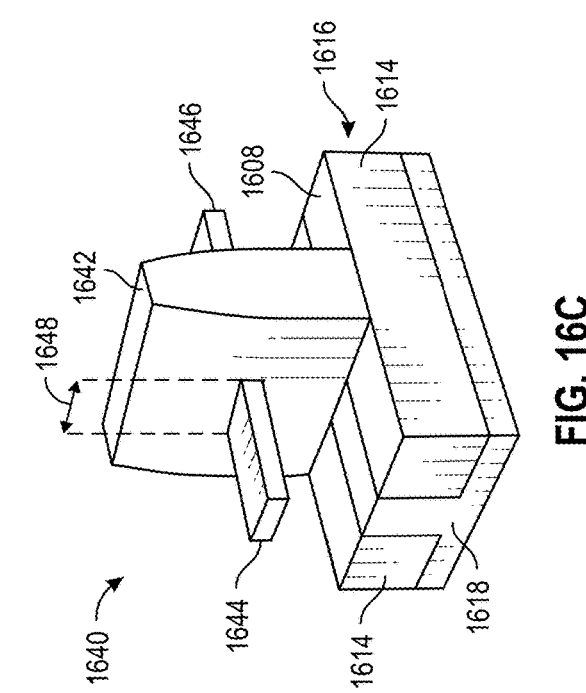
FIG. 16C
FIG. 16D

1800

PROCESSOR UNIT
1802

COMMUNICATION COMPONENT
1812

MEMORY
1804

BATTERY/POWER
1814

DISPLAY DEVICE
1806

GNSS DEVICE
1818

AUDIO OUTPUT DEVICE
1808

AUDIO INPUT DEVICE
1824

AN OTHER OUTPUT DEVICE
1810

AN OTHER INPUT DEVICE
1820

ANTENNA 1822

TECHNOLOGIES FOR MAJORITY GATES

BACKGROUND

Majority gates, in which an output of a gate is the majority of its inputs, can be used in certain logic circuits. When combined with an inverter, majority gates can be used to create general logic circuits. Majority gates made from conventional CMOS transistors require 12 to 18 MOSFETs.

BRIEF DESCRIPTION OF THE DRAWINGS

FIGS. 16A-16D are perspective views of example planar, gate-all-around, and stacked gate-all-around transistors.

DETAILED DESCRIPTION

Figure 1:
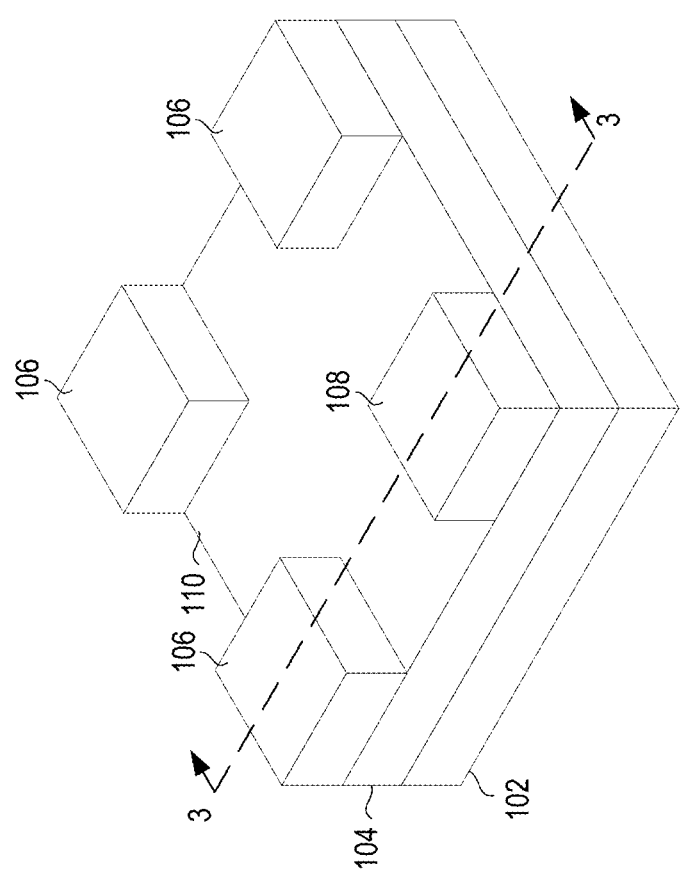
FIG. 1 is an isometric view of one embodiment of a majority gate with a ferroelectric layer.
Figure 1:
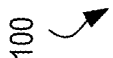
Figure 1:

In various embodiments disclosed herein, majority gates can be formed by connecting several electrically isolated inputs to a ferroelectric layer, forming a capacitor. In the illustrative embodiment, each of the inputs is a positive voltage or a negative voltage, and the polarization of the ferroelectric layer in at least part of the ferroelectric layer is determined by the majority voltage of the inputs. The part of the ferroelectric layer that is controlled by the majority voltage of the inputs can be used to drive an output of the majority gate. As the inputs are electrically isolated from each other, no current flows between the various inputs, reducing any voltage drop resulting from such current flows.

In one embodiment, the part of the ferroelectric layer that is controlled by the majority voltage of the inputs can be used to drive an output by controlling an output or by driving a channel of a transistor. In another embodiment, the ferroelectric layer is magnetoelectric, and the resulting state determines the directionality of the spin-orbit (SO) unit in a magnetoelectric spin-orbit (MESO) gate.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Figure 2:
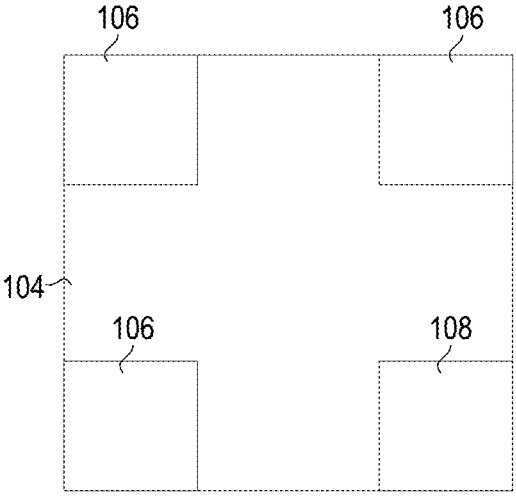
FIG. 2 is a top-down view of the majority gate of FIG. 1.
Figure 3:
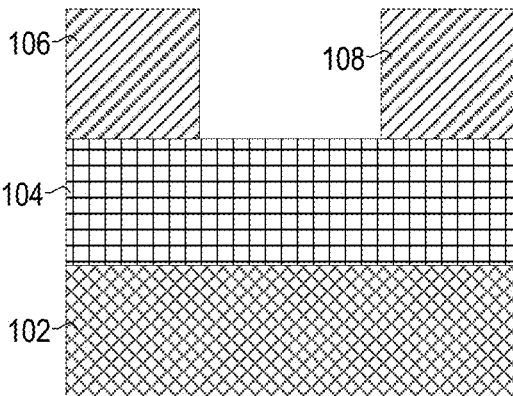
FIG. 3 is a cross-sectional side view of the majority gate of FIG. 1.

Referring now to FIG. 1, in one embodiment, a majority gate 100 includes a ground layer 102, a ferroelectric layer 104, one or more inputs 106 adjacent a top surface 110 of the ferroelectric layer 104, and an output 108 adjacent the top surface 110 of the ferroelectric layer. FIG. 2 shows a top-down view of the majority gate 100, and FIG. 3 shows a cross-sectional view of the majority gate. In the illustrative embodiment, in use, each input 106 is set to a positive or negative voltage. For example, each input 106 may be at +1 volt or −1 volt. Each input 106, the ferroelectric layer 104, and the ground layer 102 form a capacitor. In the illustrative embodiment, in the area of each input 106, the ferroelectric layer 104 is polarized in the direction of the electric field applied by the voltage on the input 106. When all of the inputs 106 are the same voltage (i.e., all positive or all negative), then the entire ferroelectric layer 104 is polarized in the same direction, including under the output 108. The polarization of the ferroelectric layer 104 then induces a voltage on the output 108, which can be used to connect to another component.

When one of the inputs 106 is different from the other two, the ferroelectric layer 104 forms domains with different polarization. The polarization of the ferroelectric layer 104 below each input 106 corresponds to the electric field applied by that input 106, and the polarization of the ferroelectric layer 104 below the output 108 is the same as the polarization under most of the inputs 106. The voltage induced on the output 108 by the ferroelectric layer can then be used to connect to another component. In this manner, the value of the output 108 is determined by the majority of the input.

The ground layer 102 can be any suitable conducting material on which the ferroelectric layer 104 can directly or indirectly be grown. In the illustrative embodiment, the ground layer 102 is strontium ruthenate ($SrRuO_3$). In another embodiment, the ground layer 102 may be copper.

The ferroelectric layer 104 may be any suitable ferroelectric material, such as lead zirconate titanate ($Pb[Zr_xTi_{1-x}]O_3$, barium titanate ($BaTiO_3$), or lead titanate ($PbTiO_3$). In some embodiments, the ferroelectric layer 104 may be a material that is also magnetoelectric, such as bismuth ferrite ($BiFeO_3$).

The inputs 106 and/or output 108 may be any suitable conductive material that can directly or indirectly interface with the ferroelectric layer. In the illustrative embodiment, the inputs 106 and/or output 108 are copper.

It should be appreciated that the embodiment shown in FIGS. 1-3 is one possible embodiment, and other embodiments are envisioned. For example, a majority gate 100 with 5, 7, 9, etc., inputs 106 may be formed, with an output 108 positioned between the various inputs such that the polarization of the ferroelectric layer 104 under the output 108 is the majority of the inputs 106. In the embodiment shown in FIGS. 1-3, each input is single-ended, i.e., one connection is provided for each input. In other embodiments, some or all of the inputs 106 may be differential, with a positive voltage applied to one surface of the ferroelectric layer 104 and a negative voltage applied to the opposite surface of the ferroelectric layer 104. In such an embodiment, the ground layer 102 may not be used. A differential output may be provided in a similar manner. Differential inputs and outputs may improve the performance of the majority gate 100, such as by increasing the switching speed and/or reducing the energy required to operate the gate.

Figure 4:
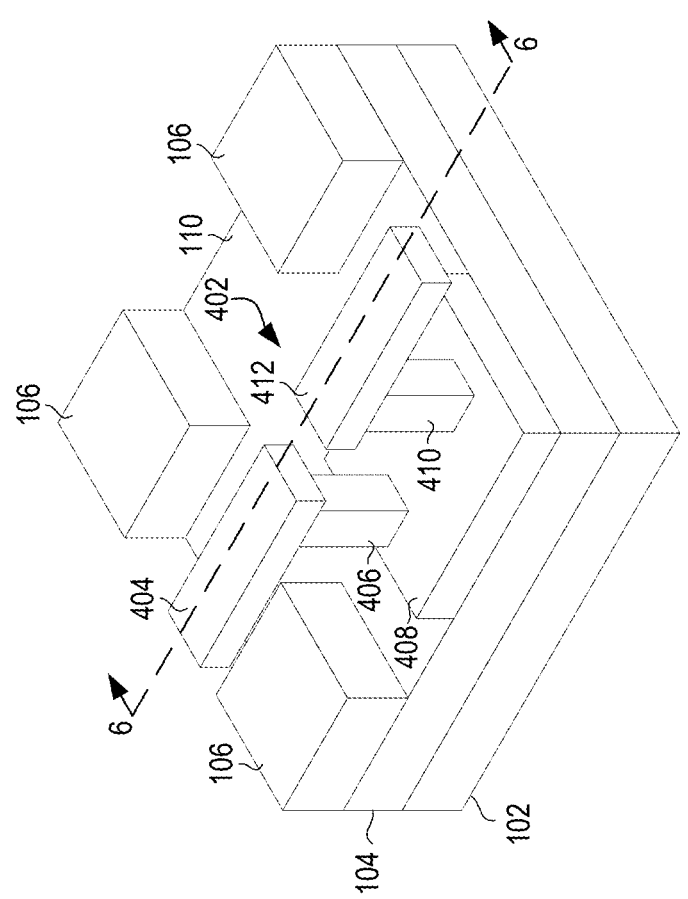
FIG. 4 is an isometric view of one embodiment of a majority gate with a ferroelectric layer.
Figure 4:
Figure 5:
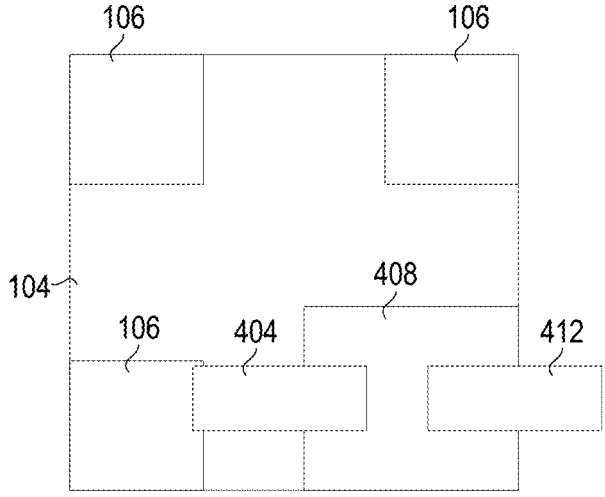
FIG. 5 is a top-down view of the majority gate of FIG. 4.
Figure 6:
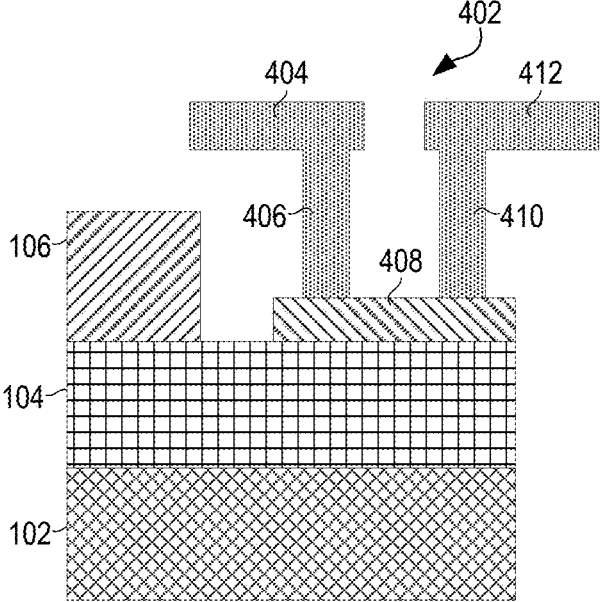
FIG. 6 is a cross-sectional side view of the majority gate of FIG. 4.

Referring now to FIG. 4, in one embodiment, a majority gate 400 includes a ground layer 102, a ferroelectric layer 104, one or more inputs 106 adjacent a top surface 110 of the ferroelectric layer 104, and an output 402. Each of the ground layer 102, ferroelectric layer 104, and inputs 106 may be similar to the corresponding component of the majority gate 100 described above, a description of which will not be repeated in the interest of clarity. However, the output 402 in the majority gate 400 is different from the output 108 in the majority gate 100. In the majority gate 400, the output 402 includes several components of a field-effect transistor. The output 402 includes a source electrode 404 and source via 406, a channel 408, and a drain via 410 and drain electrode 412. The polarization of the ferroelectric layer 104 provides the electric field that controls the ability of the channel 408 to conduct. The output 402 may act as a p-MOS or n-MOS transistor, depending on the channel 408.

The source electrode 404, source via 406, drain via 410, and drain electrode 412 may be made of any suitable conductive material. In the illustrative example, the source electrode 404, source via 406, drain via 410, and drain electrode 412 are made of copper.

The channel 408 may be made of any suitable material that can interface with the ferroelectric layer 104. For example, the channel 408 may be a transition metal dichalcogenide, germanium oxide, indium oxide, zinc oxide, barium tin oxide, and/or any other suitable material.

Figure 7:
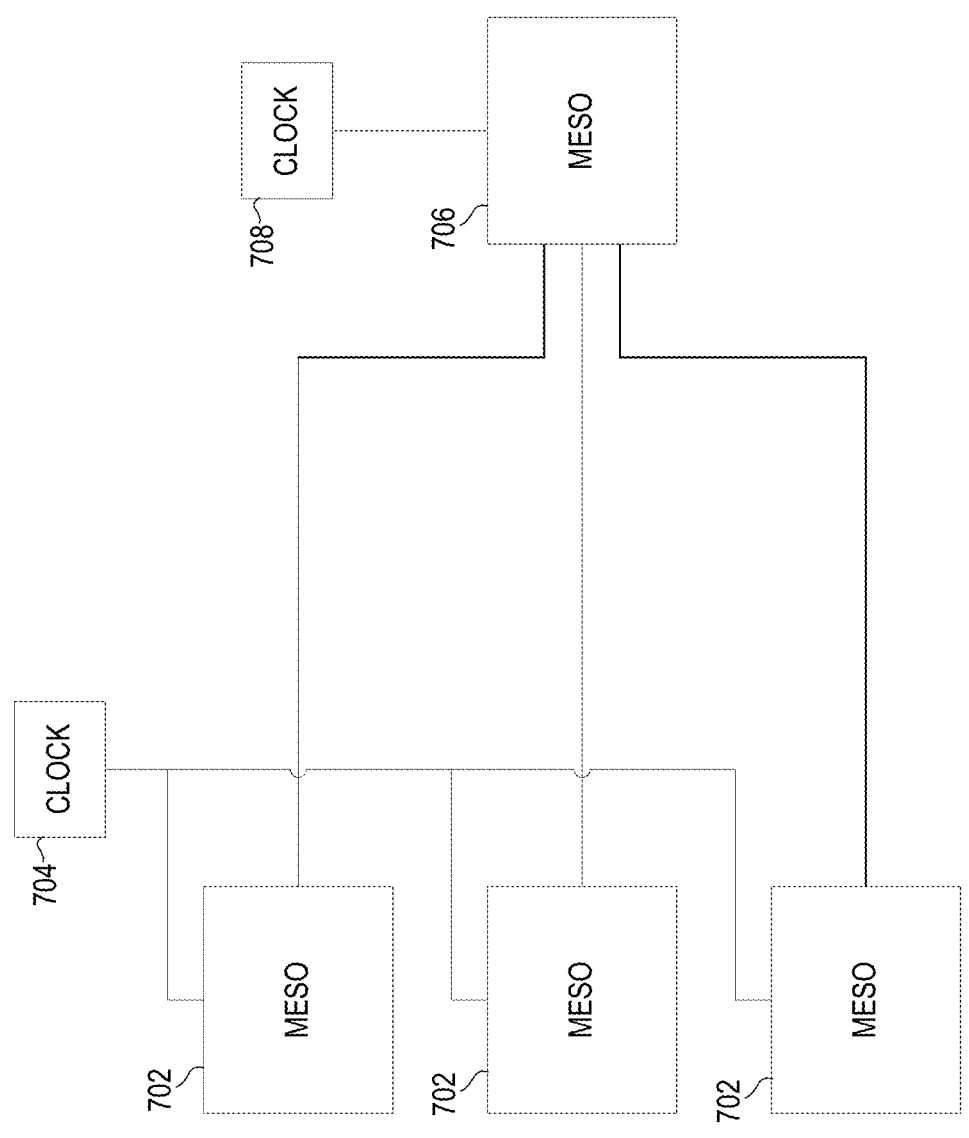
FIG. 7 is a simplified circuit diagram of one embodiment including a magnetoelectric spin-orbit (MESO) majority gate.

Referring now to FIG. 7, in one embodiment, a system 700 includes several magnetoelectrical spin-orbit (MESO) input gates 702 that are connected to a MESO majority gate 706. A first clock 704 is connected to the MESO input gates 702, and a second clock 708 is connected to the MESO majority gate 706. The MESO majority gate 706 is discussed in more detail below regarding FIGS. 8-12, and the input gates 702 are discussed in more detail below in regard to FIG. 13. The clocks 704, 708 work together with the gates 702, 706 to propagate a signal between the gates 702, 706.

Figure 8:
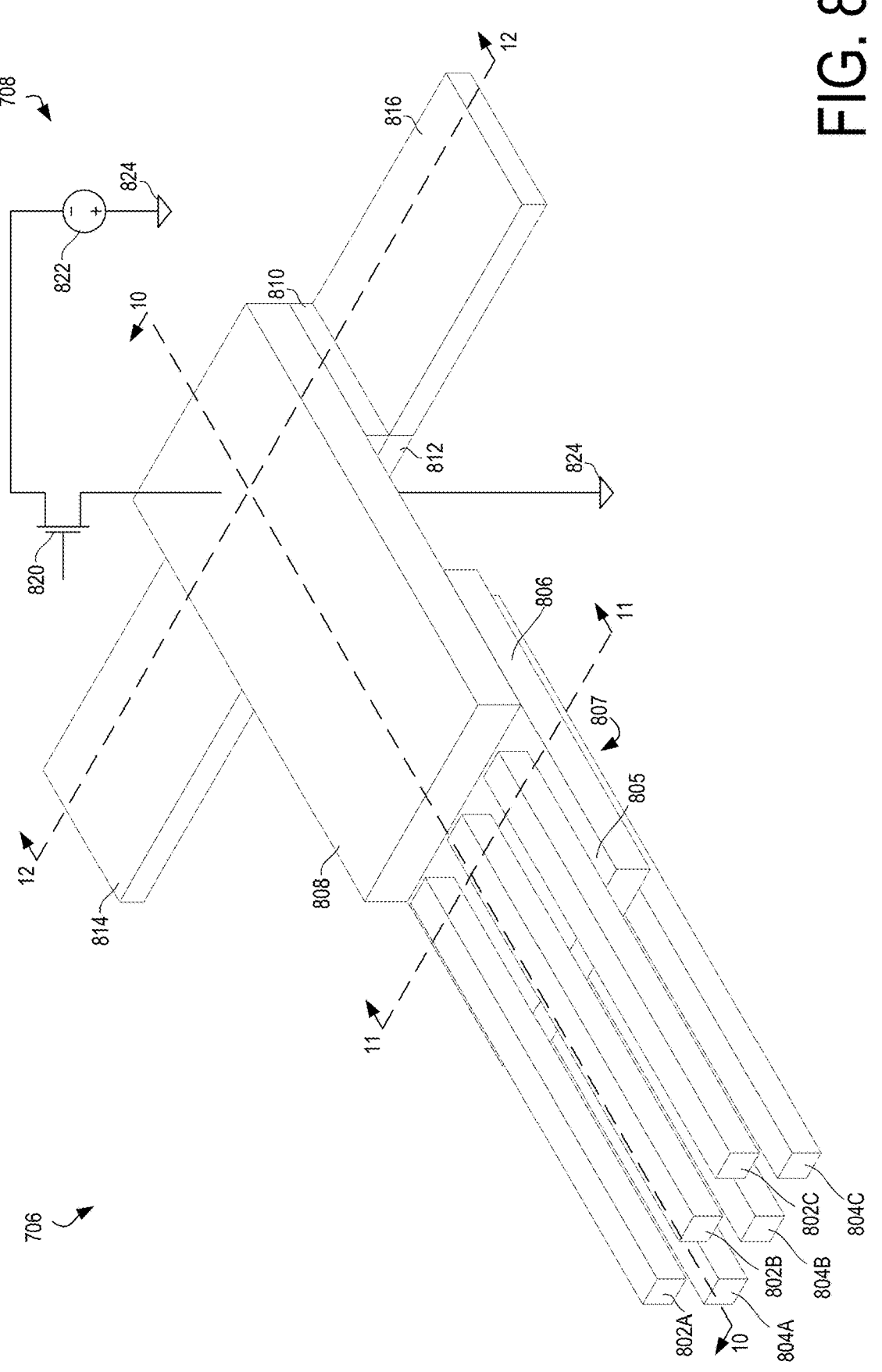
FIG. 8 is an isometric view of the MESO majority gate of FIG. 7.
Figure 9:
FIG. 9 is a top-down view of the MESO majority gate of FIG. 8.
Figure 10:
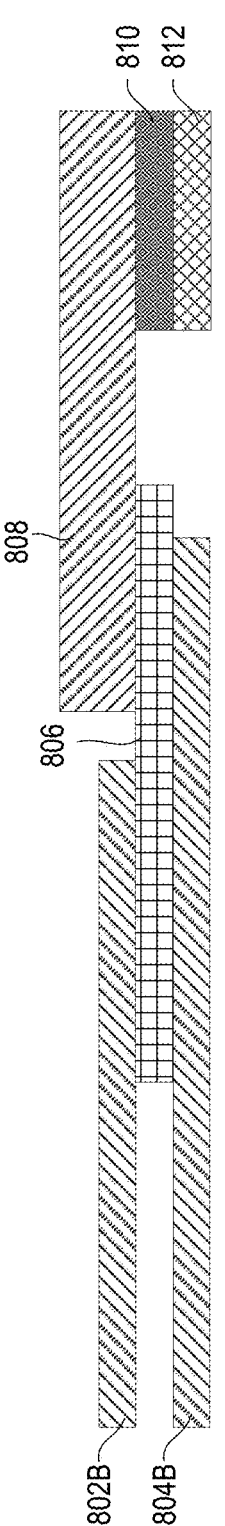
FIG. 10 is a cross-sectional view of the MESO majority gate of FIG. 8.
Figure 10:
Figure 11:
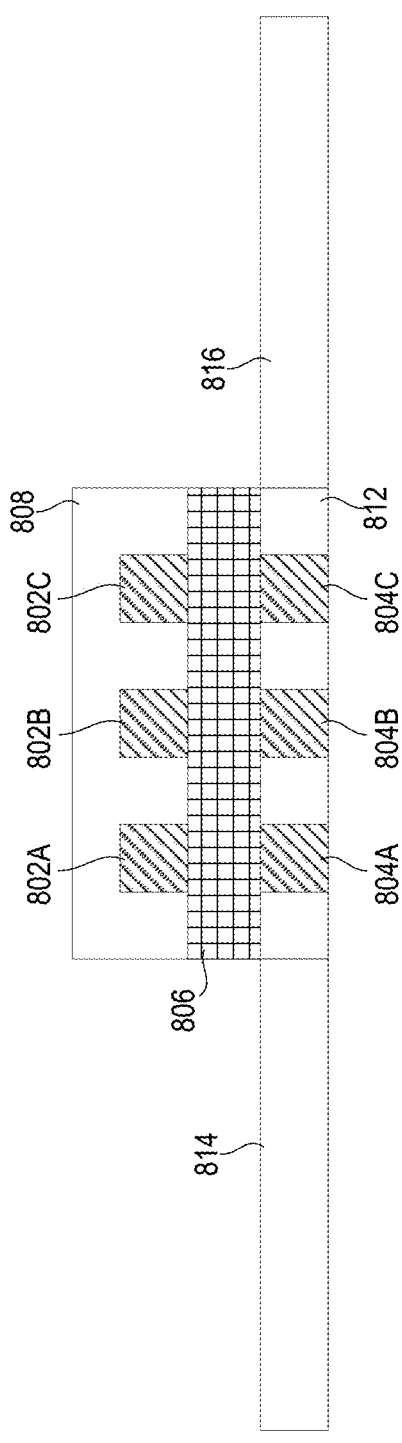
FIG. 11 is a cross-sectional view of the MESO majority gate of FIG. 8.
Figure 12:
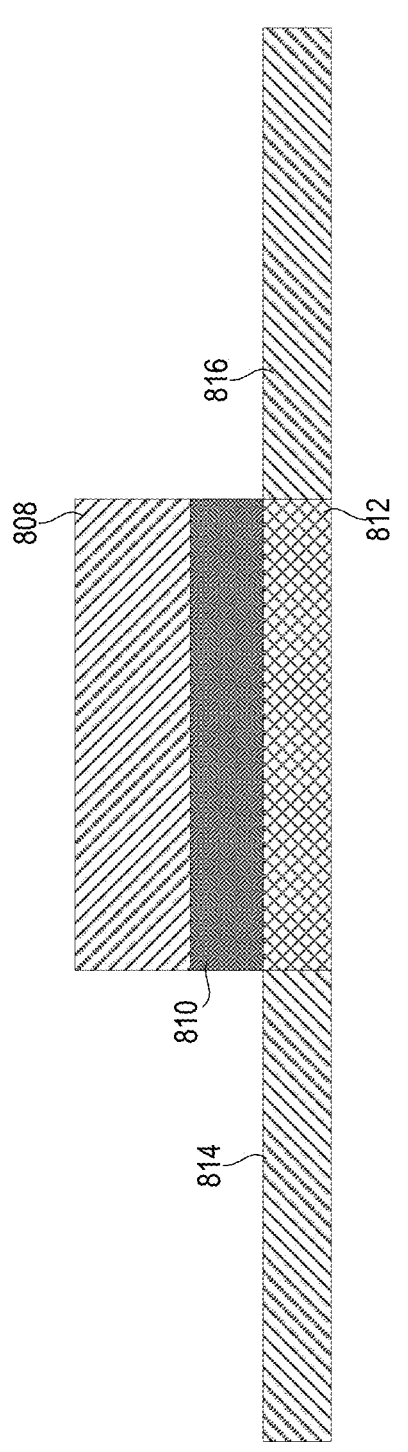
FIG. 12 is a cross-sectional view of the MESO majority gate of FIG. 8.

Referring now to FIG. 8, in one embodiment, a MESO majority gate 706 has three differential inputs, with each input formed by a top electrode 802 and a bottom electrode 804. FIG. 9 shows a top-down view of the MESO majority gate 706, and FIGS. 10-12 show various cross-sections of the MESO majority gate 706. Each top electrode 802A, 802B, 802C is adjacent a top surface 805 of a magnetoelectric layer 806, and each bottom electrode 804A, 804B, 804C is adjacent a bottom surface 807 of the magnetoelectric layer 806.

The top electrodes 802A, 802B, 802C extend over a portion of the top surface 805 of the magnetoelectric layer 806, and a ferromagnetic layer 808 extends over another portion of the top surface 805 of the magnetoelectric layer 806. The ferromagnetic layer 808 extends beyond the magnetoelectric layer 806 as shown in FIG. 8. In some embodiments, the ferromagnetic layer 808 may be a sandwich structure, with two magnetic layers coupled via an insulating layer between them. A spin injection/coherent layer 810 (in which it is easy for spin to travel) is adjacent a bottom side of the ferromagnetic layer 808, and a spin-orbit coupling stack 812 is adjacent a bottom side of the spin injection layer 810. A differential output is formed by a first output 814 adjacent one side of the spin-orbit coupling stack 812 and a second output 816 adjacent the opposite side of the spin-orbit coupling stack 812. The spin-orbit coupling stack 812 is connected to a ground 824. Current can be injected through the ferromagnetic layer 808, the spin injection layer 810, and the spin-orbit coupling stack 812 by turning on a transistor 820 connected to a voltage source 822 and the ferromagnetic layer 808. The transistor 820 and voltage source 822 act as the clock 708.

In use, in the illustrative embodiment, the inputs 802A-802C, 804A-804C are differential inputs. For example, if 802A is +1 volts, 802B is −1 volts. The inputs 802A-802C, 804A-804C polarize the magnetoelectric layer 806. In the illustrative embodiment, the magnetoelectric layer 806 is also ferroelectric. As such, when the inputs 802A-802C, 804A-804C are different, different polarization domains are formed in the magnetoelectric layer 806, as described above in regard to FIG. 1. The polarization domain of the magnetoelectric layer 806 near the ferromagnetic layer 808 is the same as the polarization domain near the majority of the inputs 802A-802C, 804A-804C. The polarization of the magnetoelectric layer 806 induces a magnetic field due to the magnetoelectric effect. The magnetization of the ferromagnetic layer 808 aligns with the magnetic field of the magnetoelectric layer 806 below it. As such, the majority state of the inputs 802A-802C, 804A-804C determines the direction of the magnetic field of the ferromagnetic layer 808.

When the transistor 820 is turned on (i.e., the clock 708 is turned on), electrons flow through the ferromagnetic layer 808. The electrons are polarized in a direction that depends on the state of the ferromagnetic layer 808 (and, therefore, in a direction that depends on the majority state of the inputs 802A-802C, 804A-804C). The polarized electrons pass through the spin injection layer 810 and the spin-orbit coupling stack 812. In the spin-orbit coupling stack 812, a force is applied to the electrons depending on their polarization due to spin-orbit coupling, creating a voltage between the two sides of the spin-orbit coupling stack 812 to which the outputs 814, 816 are connected.

Overall, the voltage state of the majority of the inputs 802A-802C, 804A-804C is converted to the polarization and magnetization of the magnetoelectric layer 806 and the magnetization of the ferromagnetic layer 808. The spin-orbit effect in the spin-orbit coupling stack 812 then maps the magnetization the ferromagnetic layer 808 back to voltage on the outputs 814, 816.

The inputs 802A-802C, 804A-804C may be similar materials to the inputs 106. In the illustrative embodiment, the inputs 802A-802C, 804A-804C are copper.

The magnetoelectric layer 806 may be any suitable magnetoelectric material. In the illustrative embodiment, the magnetoelectric layer 806 is bismuth ferrite ($BiFeO_3$). In some embodiments, the magnetoelectric layer 806 may be made of a material that is magnetoelectric at cryogenic temperatures. In some embodiments, the magnetoelectric layer 806 may be ferroelectric. In other embodiments, the magnetoelectric layer 806 may not be ferroelectric.

The ferromagnetic layer 808 may be any suitable ferromagnetic material. In the illustrative embodiment, the ferromagnetic layer 808 is cobalt and iron (CoFe).

The spin injection layer 810 is used when the spin-orbit coupling stack 812 does not interface well with the ferromagnetic layer 808. In some embodiments, the spin injection layer 810 may be omitted.

The spin-orbit coupling stack 812 may be any suitable material with a suitable spin-orbit coupling. For example, the spin-orbit coupling stack 812 may be, e.g., bismuth and silver, platinum, topological insulators, oxide, or two-dimensional materials.

It should be appreciated that FIGS. 8-12 show a MESO gate 706 with differential inputs and outputs. However, it should be appreciated that a MESO gate 706 with single-ended inputs and/or outputs are envisioned as well, similar to the single-ended inputs and outputs shown in FIG. 1.

Figure 13:
FIG. 13 is an isometric view of an input MESO gate of the system of FIG. 7.

Referring now to FIG. 13, in one embodiment, a MESO gate 702 with a single differential input 1302, 1304 is shown. Except for the inputs 1302, 1304 and the use of the first clock 704 instead of the second clock 708, the MESO gate 702 includes similar or the same components as the MESO majority gate 706, a description of which will not be repeated in the interest of clarity. The MESO gate 702 accepts a single differential input, which controls the polarization of the magnetoelectric layer 806 and, accordingly, the differential output 814, 816 of the MESO gate 702.

Referring back to FIG. 7, the outputs of three MESO gates 702 are connected to the input of a MESO majority gate 706. In use, the input to each MESO gate 702 controls the magnetization of the corresponding ferromagnetic layer 808. When the first clock 704 is activated, current passes through the ferromagnetic layer 808 of each MESO gate 702, producing an output voltage on the differential output 814, 816 of each MESO gate 702, which propagates to the inputs 802A-802C, 804A-804C of the majority MESO gate 706. The inputs to the 802A-802C, 804A-804C control the magnetization of the ferromagnetic layer 808 of the MESO gate 706. The first clock 704 is then turned off, and the second clock 708 is turned on. Current passes through the ferromagnetic layer 808 of the majority MESO gate 706, creating a voltage on the differential output 814, 816 of the majority MESO gate 706.

It should be appreciated that the embodiments described above show a single majority gate. However, in use, the majority gates can be connected together or connected to other logic components (e.g., inverters or transistors) to form more complex logic circuitry, such as a processor.

Figure 14:
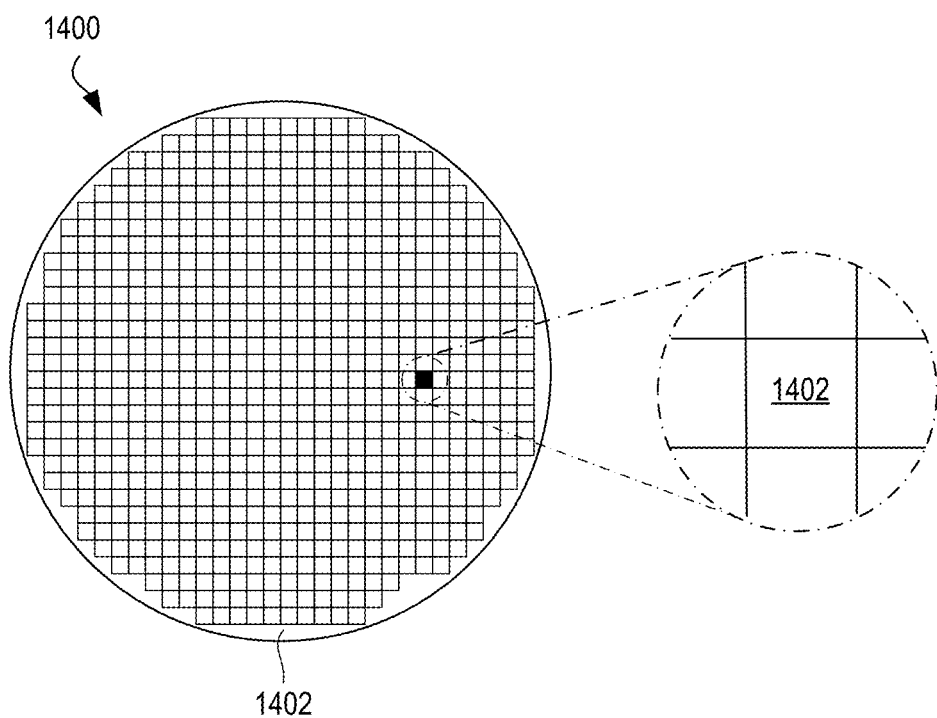
FIG. 14 is a top view of a wafer and dies that may be included in a microelectronic assembly, in accordance with any of the embodiments disclosed herein.

FIG. 14 is a top view of a wafer 1400 and dies 1402 that may include any of the majority gates 100, 706 disclosed herein. The wafer 1400 may be composed of semiconductor material and may include one or more dies 1402 having integrated circuit structures formed on a surface of the wafer 1400. The individual dies 1402 may be a repeating unit of an integrated circuit product that includes any suitable integrated circuit. After the fabrication of the semiconductor product is complete, the wafer 1400 may undergo a singulation process in which the dies 1402 are separated from one another to provide discrete "chips" of the integrated circuit product. The die 1402 may include one or more transistors (e.g., some of the transistors 1540 of FIG. 15, discussed below), supporting circuitry to route electrical signals to the transistors, passive components (e.g., signal traces, resistors, capacitors, or inductors), and/or any other integrated circuit components. In some embodiments, the wafer 1400 or the die 1402 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1402. For example, a memory array formed by multiple memory devices may be formed on a same die 1402 as a processor unit (e.g., the processor unit 1802 of FIG. 18) or other logic that is configured to store information in the memory devices or execute instructions stored in the memory array. Various ones of the microelectronic assemblies disclosed herein may be manufactured using a die-to-wafer assembly technique in which some dies are attached to a wafer 1400 that include others of the dies, and the wafer 1400 is subsequently singulated.

Figure 15:
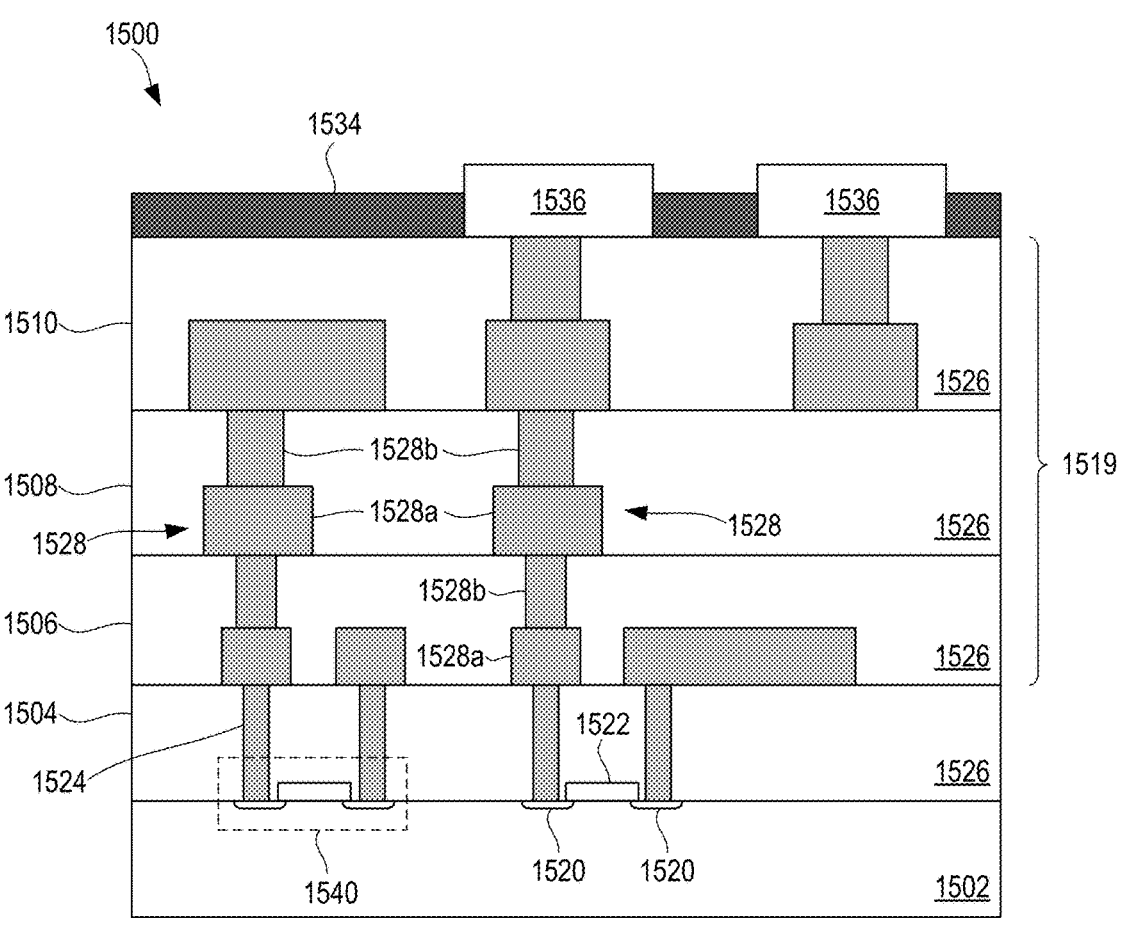
FIG. 15 is a cross-sectional side view of an integrated circuit device that may be included in a microelectronic assembly, in accordance with any of the embodiments disclosed herein.

FIG. 15 is a cross-sectional side view of an integrated circuit device 1500 that may include any of the majority gates 100, 706 disclosed herein. One or more of the integrated circuit devices 1500 may be included in one or more dies 1402 (FIG. 14). The integrated circuit device 1500 may be formed on a die substrate 1502 (e.g., the wafer 1400 of FIG. 14) and may be included in a die (e.g., the die 1402 of FIG. 14). The die substrate 1502 may be a semiconductor substrate composed of semiconductor material systems including, for example, n-type or p-type materials systems (or a combination of both). The die substrate 1502 may include, for example, a crystalline substrate formed using a bulk silicon or a silicon-on-insulator (SOI) substructure. In some embodiments, the die substrate 1502 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1502. Although a few examples of materials from which the die substrate 1502 may be formed are described here, any material that may serve as a foundation for an integrated circuit device 1500 may be used. The die substrate 1502 may be part of a singulated die (e.g., the dies 1402 of FIG. 14) or a wafer (e.g., the wafer 1400 of FIG. 14).

The integrated circuit device 1500 may include one or more device layers 1504 disposed on the die substrate 1502. The device layer 1504 may include features of one or more transistors 1540 (e.g., metal oxide semiconductor field-effect transistors (MOSFETs)) formed on the die substrate 1502. The transistors 1540 may include, for example, one or more source and/or drain (S/D) regions 1520, a gate 1522 to control current flow between the S/D regions 1520, and one or more S/D contacts 1524 to route electrical signals to/from the S/D regions 1520. The transistors 1540 may include additional features not depicted for the sake of clarity, such as device isolation regions, gate contacts, and the like. The transistors 1540 are not limited to the type and configuration depicted in FIG. 15 and may include a wide variety of other types and configurations such as, for example, planar transistors, non-planar transistors, or a combination of both. Non-planar transistors may include FinFET transistors, such as double-gate transistors or tri-gate transistors, and wraparound or all-around gate transistors, such as nanoribbon, nanosheet, or nanowire transistors.

FIGS. 16A-16D are simplified perspective views of example planar, FinFET, gate-all-around, and stacked gate-all-around transistors. The transistors illustrated in FIGS. 16A-16D are formed on a substrate 1616 having a surface 1608. Isolation regions 1614 separate the source and drain regions of the transistors from other transistors and from a bulk region 1618 of the substrate 1616.

FIG. 16A is a perspective view of an example planar transistor 1600 comprising a gate 1602 that controls current flow between a source region 1604 and a drain region 1606. The transistor 1600 is planar in that the source region 1604 and the drain region 1606 are planar with respect to the substrate surface 1608.

FIG. 16B is a perspective view of an example FinFET transistor 1620 comprising a gate 1622 that controls current flow between a source region 1624 and a drain region 1626. The transistor 1620 is non-planar in that the source region 1624 and the drain region 1626 comprise "fins" that extend upwards from the substrate surface 1608. As the gate 1622 encompasses three sides of the semiconductor fin that extends from the source region 1624 to the drain region 1626, the transistor 1620 can be considered a tri-gate transistor. FIG. 16B illustrates one S/D fin extending through the gate 1622, but multiple S/D fins can extend through the gate of a FinFET transistor.

FIG. 16C is a perspective view of a gate-all-around (GAA) transistor 1640 comprising a gate 1642 that controls current flow between a source region 1644 and a drain region 1646. The transistor 1640 is non-planar in that the source region 1644 and the drain region 1646 are elevated from the substrate surface 1608.

FIG. 16D is a perspective view of a GAA transistor 1660 comprising a gate 1662 that controls current flow between multiple elevated source regions 1664 and multiple elevated drain regions 1666. The transistor 1660 is a stacked GAA transistor as the gate controls the flow of current between multiple elevated S/D regions stacked on top of each other. The transistors 1640 and 1660 are considered gate-all-around transistors as the gates encompass all sides of the semiconductor portions that extends from the source regions to the drain regions. The transistors 1640 and 1660 can alternatively be referred to as nanowire, nanosheet, or nanoribbon transistors depending on the width (e.g., widths 1648 and 1668 of transistors 1640 and 1660, respectively) of the semiconductor portions extending through the gate.

Returning to FIG. 15, a transistor 1540 may include a gate 1522 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1540 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1540 along the source-channel-drain direction, the gate electrode may consist of a U-shaped structure that includes a bottom portion substantially parallel to the surface of the die substrate 1502 and two sidewall portions that are substantially perpendicular to the top surface of the die substrate 1502. In other embodiments, at least one of the metal layers that form the gate electrode may simply be a planar layer that is substantially parallel to the top surface of the die substrate 1502 and does not include sidewall portions substantially perpendicular to the top surface of the die substrate 1502. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1520 may be formed within the die substrate 1502 adjacent to the gate 1522 of individual transistors 1540. The S/D regions 1520 may be formed using an implantation/diffusion process or an etching/deposition process, for example. In the former process, dopants such as boron, aluminum, antimony, phosphorous, or arsenic may be ion-implanted into the die substrate 1502 to form the S/D regions 1520. An annealing process that activates the dopants and causes them to diffuse farther into the die substrate 1502 may follow the ion-implantation process. In the latter process, the die substrate 1502 may first be etched to form recesses at the locations of the S/D regions 1520. An epitaxial deposition process may then be carried out to fill the recesses with material that is used to fabricate the S/D regions 1520. In some implementations, the S/D regions 1520 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1520 may be formed using one or more alternate semiconductor materials such as germanium or a group III-V material or alloy. In further embodiments, one or more layers of metal and/or metal alloys may be used to form the S/D regions 1520.

Electrical signals, such as power and/or input/output (I/O) signals, may be routed to and/or from the devices (e.g., transistors 1540) of the device layer 1504 through one or more interconnect layers disposed on the device layer 1504 (illustrated in FIG. 15 as interconnect layers 1506-1510). For example, electrically conductive features of the device layer 1504 (e.g., the gate 1522 and the S/D contacts 1524) may be electrically coupled with the interconnect structures 1528 of the interconnect layers 1506-1510. The one or more interconnect layers 1506-1510 may form a metallization stack (also referred to as an "ILD stack") 1519 of the integrated circuit device 1500.

The interconnect structures 1528 may be arranged within the interconnect layers 1506-1510 to route electrical signals according to a wide variety of designs; in particular, the arrangement is not limited to the particular configuration of interconnect structures 1528 depicted in FIG. 15. Although a particular number of interconnect layers 1506-1510 is depicted in FIG. 15, embodiments of the present disclosure include integrated circuit devices having more or fewer interconnect layers than depicted.

In some embodiments, the interconnect structures 1528 may include lines 1528a and/or vias 1528b filled with an electrically conductive material such as a metal. The lines 1528a may be arranged to route electrical signals in a direction of a plane that is substantially parallel with a surface of the die substrate 1502 upon which the device layer 1504 is formed. The vias 1528b may be arranged to route electrical signals in a direction of a plane that is substantially perpendicular to the surface of the die substrate 1502 upon which the device layer 1504 is formed. In some embodiments, the vias 1528b may electrically couple lines 1528a of different interconnect layers 1506-1510 together.

The interconnect layers 1506-1510 may include a dielectric material 1526 disposed between the interconnect structures 1528, as shown in FIG. 15. In some embodiments, dielectric material 1526 disposed between the interconnect structures 1528 in different ones of the interconnect layers 1506-1510 may have different compositions; in other embodiments, the composition of the dielectric material 1526 between different interconnect layers 1506-1510 may be the same. The device layer 1504 may include a dielectric material 1526 disposed between the transistors 1540 and a bottom layer of the metallization stack as well. The dielectric material 1526 included in the device layer 1504 may have a different composition than the dielectric material 1526 included in the interconnect layers 1506-1510; in other embodiments, the composition of the dielectric material 1526 in the device layer 1504 may be the same as a dielectric material 1526 included in any one of the interconnect layers 1506-1510.

A first interconnect layer 1506 (referred to as Metal 1 or "M1") may be formed directly on the device layer 1504. In some embodiments, the first interconnect layer 1506 may include lines 1528a and/or vias 1528b, as shown. The lines 1528a of the first interconnect layer 1506 may be coupled with contacts (e.g., the S/D contacts 1524) of the device layer 1504. The vias 1528b of the first interconnect layer 1506 may be coupled with the lines 1528a of a second interconnect layer 1508.

The second interconnect layer 1508 (referred to as Metal 2 or "M2") may be formed directly on the first interconnect layer 1506. In some embodiments, the second interconnect layer 1508 may include via 1528b to couple the lines 1528a of the second interconnect layer 1508 with the lines 1528a of a third interconnect layer 1510. Although the lines 1528a and the vias 1528b are structurally delineated with a line within individual interconnect layers for the sake of clarity, the lines 1528a and the vias 1528b may be structurally and/or materially contiguous (e.g., simultaneously filled during a dual-damascene process) in some embodiments.

The third interconnect layer 1510 (referred to as Metal 3 or "M3") (and additional interconnect layers, as desired) may be formed in succession on the second interconnect layer 1508 according to similar techniques and configurations described in connection with the second interconnect layer 1508 or the first interconnect layer 1506. In some embodiments, the interconnect layers that are "higher up" in the metallization stack 1519 in the integrated circuit device 1500 (i.e., farther away from the device layer 1504) may be thicker that the interconnect layers that are lower in the metallization stack 1519, with lines 1528a and vias 1528b in the higher interconnect layers being thicker than those in the lower interconnect layers.

The integrated circuit device 1500 may include a solder resist material 1534 (e.g., polyimide or similar material) and one or more conductive contacts 1536 formed on the interconnect layers 1506-1510. In FIG. 15, the conductive contacts 1536 are illustrated as taking the form of bond pads. The conductive contacts 1536 may be electrically coupled with the interconnect structures 1528 and configured to route the electrical signals of the transistor(s) 1540 to external devices. For example, solder bonds may be formed on the one or more conductive contacts 1536 to mechanically and/or electrically couple an integrated circuit die including the integrated circuit device 1500 with another component (e.g., a printed circuit board). The integrated circuit device 1500 may include additional or alternate structures to route the electrical signals from the interconnect layers 1506-1510; for example, the conductive contacts 1536 may include other analogous features (e.g., posts) that route the electrical signals to external components.

In some embodiments in which the integrated circuit device 1500 is a double-sided die, the integrated circuit device 1500 may include another metallization stack (not shown) on the opposite side of the device layer(s) 1504. This metallization stack may include multiple interconnect layers as discussed above with reference to the interconnect layers 1506-1510, to provide conductive pathways (e.g., including conductive lines and vias) between the device layer(s) 1504 and additional conductive contacts (not shown) on the opposite side of the integrated circuit device 1500 from the conductive contacts 1536.

In other embodiments in which the integrated circuit device 1500 is a double-sided die, the integrated circuit device 1500 may include one or more through silicon vias (TSVs) through the die substrate 1502; these TSVs may make contact with the device layer(s) 1504, and may provide conductive pathways between the device layer(s) 1504 and additional conductive contacts (not shown) on the opposite side of the integrated circuit device 1500 from the conductive contacts 1536. In some embodiments, TSVs extending through the substrate can be used for routing power and ground signals from conductive contacts on the opposite side of the integrated circuit device 1500 from the conductive contacts 1536 to the transistors 1540 and any other components integrated into the die 1500, and the metallization stack 1519 can be used to route I/O signals from the conductive contacts 1536 to transistors 1540 and any other components integrated into the die 1500.

Multiple integrated circuit devices 1500 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 17:
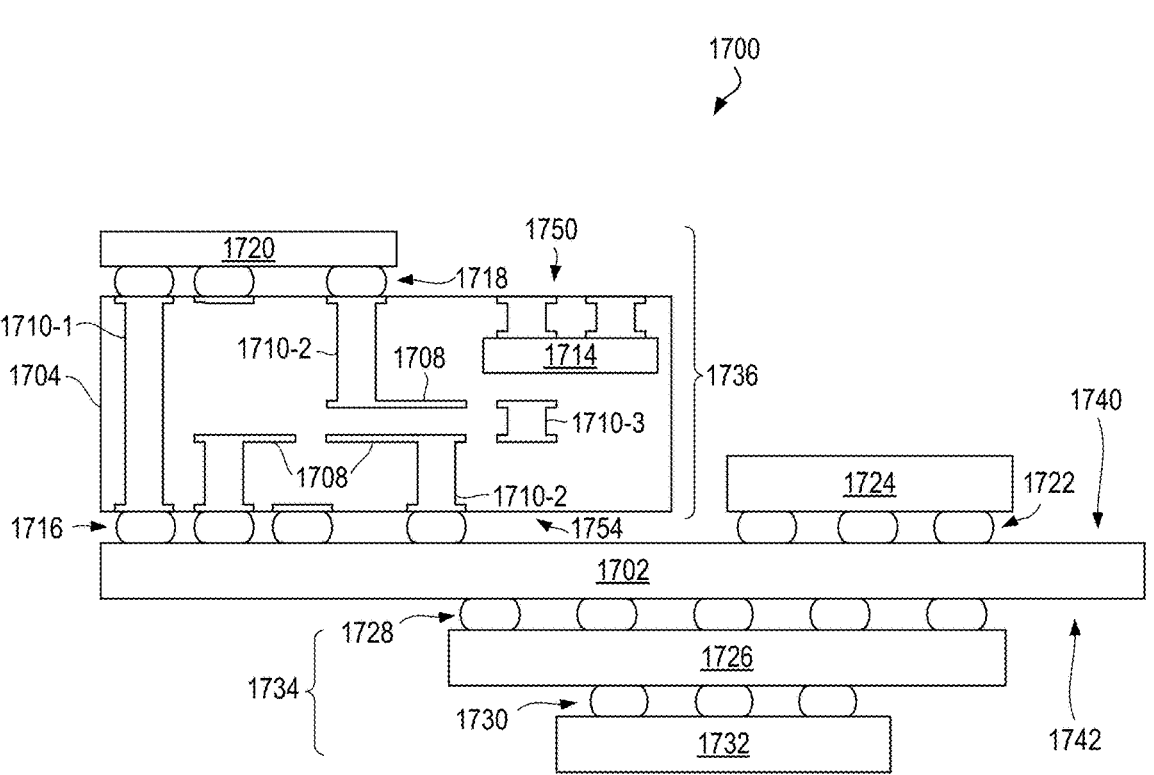
FIG. 17 is a cross-sectional side view of an integrated circuit device assembly that may include a microelectronic assembly, in accordance with any of the embodiments disclosed herein.

FIG. 17 is a cross-sectional side view of an integrated circuit device assembly 1700 that may include any of the majority gates 100, 706 disclosed herein. The integrated circuit device assembly 1700 includes a number of components disposed on a circuit board 1702 (which may be a motherboard, system board, mainboard, etc.). The integrated circuit device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. The integrated circuit device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1736 may include an integrated circuit component 1720 coupled to an interposer 1704 by coupling components 1718. The coupling components 1718 may take any suitable form for the application, such as the forms discussed above with reference to the coupling components 1716. Although a single integrated circuit component 1720 is shown in FIG. 17, multiple integrated circuit components may be coupled to the interposer 1704; indeed, additional interposers may be coupled to the interposer 1704. The interposer 1704 may provide an intervening substrate used to bridge the circuit board 1702 and the integrated circuit component 1720.

The integrated circuit component 1720 may be a packaged or unpackaged integrated circuit product that includes one or more integrated circuit dies (e.g., the die 1402 of FIG. 14, the integrated circuit device 1500 of FIG. 15) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1720, a single monolithic integrated circuit die comprises solder bumps attached to contacts on the die. The solder bumps allow the die to be directly attached to the interposer 1704. The integrated circuit component 1720 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1720 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1720 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1720 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1704 may spread connections to a wider pitch or reroute a connection to a different connection. For example, the interposer 1704 may couple the integrated circuit component 1720 to a set of ball grid array (BGA) conductive contacts of the coupling components 1716 for coupling to the circuit board 1702. In the embodiment illustrated in FIG. 17, the integrated circuit component 1720 and the circuit board 1702 are attached to opposing sides of the interposer 1704; in other embodiments, the integrated circuit component 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through hole vias 1710-1 (that extend from a first face 1750 of the interposer 1704 to a second face 1754 of the interposer 1704), blind vias 1710-2 (that extend from the first or second faces 1750 or 1754 of the interposer 1704 to an internal metal layer), and buried vias 1710-3 (that connect internal metal layers).

In some embodiments, the interposer 1704 can comprise a silicon interposer. Through silicon vias (TSV) extending through the silicon interposer can connect connections on a first face of a silicon interposer to an opposing second face of the silicon interposer. In some embodiments, an interposer 1704 comprising a silicon interposer can further comprise one or more routing layers to route connections on a first face of the interposer 1704 to an opposing second face of the interposer 1704.

The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The integrated circuit device assembly 1700 may include an integrated circuit component 1724 coupled to the first face 1740 of the circuit board 1702 by coupling components 1722. The coupling components 1722 may take the form of any of the embodiments discussed above with reference to the coupling components 1716, and the integrated circuit component 1724 may take the form of any of the embodiments discussed above with reference to the integrated circuit component 1720.

The integrated circuit device assembly 1700 illustrated in FIG. 17 includes a package-on-package structure 1734 coupled to the second face 1742 of the circuit board 1702 by coupling components 1728. The package-on-package structure 1734 may include an integrated circuit component 1726 and an integrated circuit component 1732 coupled together by coupling components 1730 such that the integrated circuit component 1726 is disposed between the circuit board 1702 and the integrated circuit component 1732. The coupling components 1728 and 1730 may take the form of any of the embodiments of the coupling components 1716 discussed above, and the integrated circuit components 1726 and 1732 may take the form of any of the embodiments of the integrated circuit component 1720 discussed above. The package-on-package structure 1734 may be configured in accordance with any of the package-on-package structures known in the art.

Figure 18:
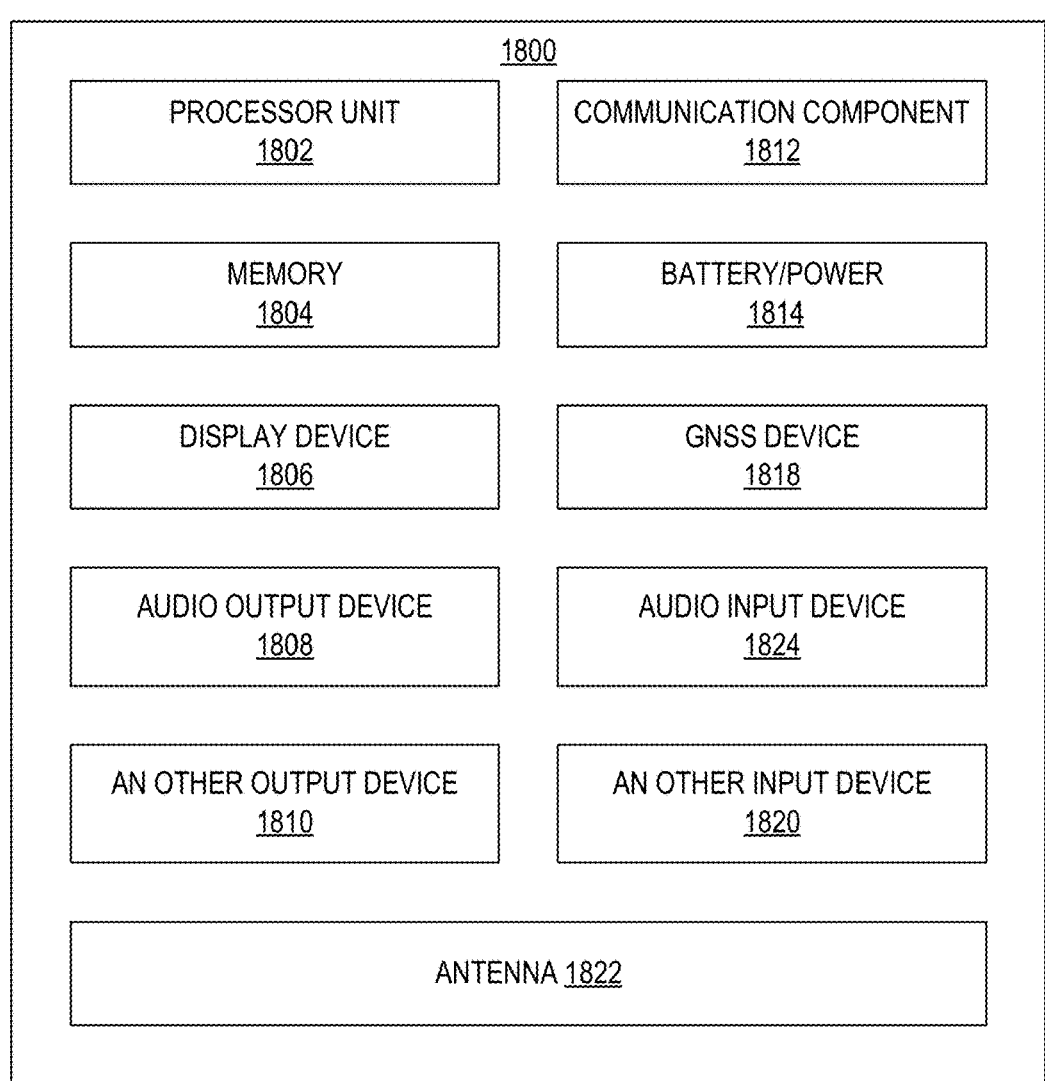
FIG. 18 is a block diagram of an example electrical device that may include a microelectronic assembly, in accordance with any of the embodiments disclosed herein.

FIG. 18 is a block diagram of an example electrical device 1800 that may include one or more of the majority gates 100, 706 disclosed herein. For example, any suitable ones of the components of the electrical device 1800 may include one or more of the integrated circuit device assemblies 1700, integrated circuit components 1720, integrated circuit devices 1500, or integrated circuit dies 1402 disclosed herein. A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards mainboards, or system boards. In some embodiments, one or more of these components are fabricated onto a single system-on-a-chip (SoC) die.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include one or more processor units 1802 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1802 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1800 may include a memory 1804, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1804 may include memory that is located on the same integrated circuit die as the processor unit 1802. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1800 can comprise one or more processor units 1802 that are heterogeneous or asymmetric to another processor unit 1802 in the electrical device 1800. There can be a variety of differences between the processing units 1802 in a system in terms of a spectrum of metrics of merit including architectural, microarchitectural, thermal, power consumption characteristics, and the like. These differences can effectively manifest themselves as asymmetry and heterogeneity among the processor units 1802 in the electrical device 1800.

In some embodiments, the electrical device 1800 may include a communication component 1812 (e.g., one or more communication components). For example, the communication component 1812 can manage wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication component 1812 may manage wired communications, such as electrical, optical, or any other suitable communication protocols (e.g., IEEE 802.3 Ethernet standards). As noted above, the communication component 1812 may include multiple communication components. For instance, a first communication component 1812 may be dedicated to shorter-range wireless communications such as Wi-Fi or Bluetooth, and a second communication component 1812 may be dedicated to longer-range wireless communications such as global positioning system (GPS), EDGE, GPRS, CDMA, WiMAX, LTE, EV-DO, or others. In some embodiments, a first communication component 1812 may be dedicated to wireless communications, and a second communication component 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any embedded or wired or wirelessly connected external device that generates an audible indicator, such speakers, headsets, or earbuds.

The electrical device 1800 may include an audio input device 1824 (or corresponding interface circuitry, as discussed above). The audio input device 1824 may include any embedded or wired or wirelessly connected device that generates a signal representative of a sound, such as microphones, microphone arrays, or digital instruments (e.g., instruments having a musical instrument digital interface (MIDI) output). The electrical device 1800 may include a Global Navigation Satellite System (GNSS) device 1818 (or corresponding interface circuitry, as discussed above), such as a Global Positioning System (GPS) device. The GNSS device 1818 may be in communication with a satellite-based system and may determine a geolocation of the electrical device 1800 based on information received from one or more GNSS satellites, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1800 may be any other electronic device that processes data.

In some embodiments, the electrical device 1800 may comprise multiple discrete physical components. Given the range of devices that the electrical device 1800 can be manifested as in various embodiments, in some embodiments, the electrical device 1800 can be referred to as a computing device or a computing system.

Examples

Illustrative examples of the technologies disclosed herein are provided below. An embodiment of the technologies may include any one or more, and any combination of, the examples described below.

Example 1 includes a die comprising a majority gate, the majority gate comprising a ferroelectric layer; three or more inputs, wherein individual inputs of the three or more inputs, when a voltage is applied, induces a polarization in the ferroelectric layer based on the applied voltage; and an output, wherein a voltage on the output depends on a polarization of the ferroelectric layer, wherein individual inputs of the three or more inputs are electrically isolated from other inputs of the three or more inputs.

Example 2 includes the subject matter of Example 1, and wherein the output depends on a polarization of the ferroelectric layer near the output, wherein the polarization of the ferroelectric layer near the output is in the same direction as a polarization of the ferroelectric layer near a majority of the three or more inputs.

Example 3 includes the subject matter of any of Examples 1 and 2, and wherein the ferroelectric layer comprises a top surface, wherein individual inputs of the three or more inputs are adjacent the top surface of the ferroelectric layer, wherein the output is adjacent the top surface of the ferroelectric layer.

Example 4 includes the subject matter of any of Examples 1-3, and wherein the output comprises a source; a channel; and a drain, wherein the polarization of the ferroelectric layer near the output controls conductivity of the channel.

Example 5 includes the subject matter of any of Examples 1-4, and further including a ferromagnetic layer adjacent the ferroelectric layer, wherein the ferroelectric layer is magnetoelectric, wherein individual inputs of the three or more inputs, when a voltage is applied, induces a magnetization in the ferroelectric layer based on the applied voltage; a spin-orbit coupling stack layer coupled to the ferromagnetic layer; and electrodes coupled to the ferromagnetic layer and the spin-orbit coupling stack layer to pass current through the ferromagnetic layer and the spin-orbit coupling stack layer, wherein the output is adjacent to the spin-orbit coupling stack layer, wherein the current, when passed through the ferromagnetic layer, becomes spin polarized, wherein the spin polarized current, when passed through the spin-orbit coupling stack, induces a voltage on the output.

Example 6 includes the subject matter of any of Examples 1-5, and further including a clock to control current through the electrodes.

Example 7 includes the subject matter of any of Examples 1-6, and further including a spin injection layer between the ferromagnetic layer and the spin-orbit coupling stack, wherein the spin injection layer is adjacent to the ferromagnetic layer, wherein the spin-orbit coupling stack is adjacent to the spin injection layer.

Example 8 includes the subject matter of any of Examples 1-7, and wherein the spin-orbit coupling stack is adjacent the ferromagnetic layer.

Example 9 includes the subject matter of any of Examples 1-8, and wherein the ferromagnetic layer comprises cobalt and iron.

Example 10 includes the subject matter of any of Examples 1-9, and wherein the spin-orbit coupling stack comprises platinum.

Example 11 includes the subject matter of any of Examples 1-10, and wherein the spin-orbit coupling stack comprises a topological insulator.

Example 12 includes the subject matter of any of Examples 1-11, and wherein the ferroelectric layer comprises bismuth, iron, and oxygen.

Example 13 includes a processor comprising the die of any of Examples 1-13.

Example 14 includes a die comprising a majority gate, the majority gate comprising a magnetoelectric layer; three or more inputs, wherein individual inputs of the three or more inputs, when a voltage is applied, induces a magnetization in the magnetoelectric layer based on the applied voltage, wherein individual inputs of the three or more inputs are electrically isolated from other inputs of the three or more inputs; a ferromagnetic layer coupled to the magnetoelectric layer, wherein the magnetization in the magnetoelectric layer controls a magnetic field in the ferromagnetic layer; a spin-orbit coupling stack layer coupled to the ferromagnetic layer; electrodes coupled to the ferromagnetic layer and the spin-orbit coupling stack layer to pass current through the ferromagnetic layer and the spin-orbit coupling stack layer; and an output coupled to the spin-orbit coupling stack layer, wherein the current, when passed through the ferromagnetic layer, becomes spin polarized, wherein the spin polarized current, when passed through the spin-orbit coupling stack, induces a voltage on the output.

Example 15 includes the subject matter of Example 14, and further including a clock to control current through the electrodes.

Example 16 includes the subject matter of any of Examples 14 and 15, and further including a spin injection layer between the ferromagnetic layer and the spin-orbit coupling stack, wherein the spin injection layer is adjacent to the ferromagnetic layer, wherein the spin-orbit coupling stack is adjacent to the spin injection layer.

Example 17 includes the subject matter of any of Examples 14-16, and wherein the spin-orbit coupling stack is adjacent the ferromagnetic layer.

Example 18 includes the subject matter of any of Examples 14-17, and wherein the ferromagnetic layer comprises cobalt and iron.

Example 19 includes the subject matter of any of Examples 14-18, and wherein the spin-orbit coupling stack comprises platinum.

Example 20 includes the subject matter of any of Examples 14-19, and wherein the spin-orbit coupling stack comprises a topological insulator.

Example 21 includes a processor comprising the die of any of Examples 14-19.

Example 22 includes a die comprising three or more inputs, wherein individual inputs of the three or more inputs are electrically isolated from other inputs of the three or more inputs; an output; and means for creating a voltage on the output based on a majority of input voltages on the three or more inputs.

Example 23 includes the subject matter of Example 22, and wherein the means for creating the voltage on the output comprises a ferroelectric layer, wherein individual inputs of the three or more inputs, when a voltage is applied, induces a polarization in the ferroelectric layer based on the applied voltage, wherein a voltage on the output depends on a polarization of the ferroelectric layer.

Example 24 includes the subject matter of any of Examples 22 and 23, and wherein the output depends on a polarization of the ferroelectric layer near the output, wherein the polarization of the ferroelectric layer near the output is in the same direction as a polarization of the ferroelectric layer near a majority of the three or more inputs.

Example 25 includes the subject matter of any of Examples 22-24, and wherein the ferroelectric layer comprises a top surface, wherein individual inputs of the three or more inputs are adjacent the top surface of the ferroelectric layer, wherein the output is adjacent the top surface of the ferroelectric layer.

Example 26 includes the subject matter of any of Examples 22-25, and wherein the output comprises a source; a channel; and a drain, wherein the polarization of the ferroelectric layer near the output controls conductivity of the channel.

Example 27 includes the subject matter of any of Examples 22-26, and wherein the means for creating the voltage on the output comprises a ferromagnetic layer adjacent the ferroelectric layer, wherein the ferroelectric layer is magnetoelectric, wherein individual inputs of the three or more inputs, when a voltage is applied, induces a magnetization in the ferroelectric layer based on the applied voltage; a spin-orbit coupling stack layer coupled to the ferromagnetic layer; and electrodes coupled to the ferromagnetic layer and the spin-orbit coupling stack layer to pass current through the ferromagnetic layer and the spin-orbit coupling stack layer, wherein the output is adjacent to the spin-orbit coupling stack layer, wherein the current, when passed through the ferromagnetic layer, becomes spins polarized, wherein the spin polarized current, when passed through the spin-orbit coupling stack, induces a voltage on the output.

Example 28 includes the subject matter of any of Examples 22-27, and further including a clock to control current through the electrodes.

Example 29 includes the subject matter of any of Examples 22-28, and further including a spin injection layer between the ferromagnetic layer and the spin-orbit coupling stack, wherein the spin injection layer is adjacent to the ferromagnetic layer, wherein the spin-orbit coupling stack is adjacent to the spin injection layer.

Example 30 includes the subject matter of any of Examples 22-29, and wherein the spin-orbit coupling stack is adjacent the ferromagnetic layer.

Example 31 includes the subject matter of any of Examples 22-30, and wherein the ferromagnetic layer comprises cobalt and iron.

Example 32 includes the subject matter of any of Examples 22-31, and wherein the spin-orbit coupling stack comprises platinum.

Example 33 includes the subject matter of any of Examples 22-32, and wherein the spin-orbit coupling stack comprises a topological insulator.

Example 34 includes the subject matter of any of Examples 22-33, and wherein the ferroelectric layer comprises bismuth, iron, and oxygen.

Example 35 includes a processor comprising the die of any of Examples 22-34.

The invention claimed is:

1. A die comprising a majority gate, the majority gate comprising:
   a ferroelectric layer;

three or more inputs, wherein individual inputs of the three or more inputs, when a voltage is applied, induces a polarization in the ferroelectric layer based on an electric field from the applied voltage extending into the ferroelectric layer; and an output, wherein a voltage on the output depends on a polarization of the ferroelectric layer, wherein individual inputs of the three or more inputs are electrically isolated from other inputs of the three or more inputs.

2. The die of claim 1, wherein the output depends on a polarization of the ferroelectric layer near the output, wherein the polarization of the ferroelectric layer near the output is in the same direction as a polarization of the ferroelectric layer near a majority of the three or more inputs.

3. The die of claim 1, wherein the ferroelectric layer comprises a top surface, wherein individual inputs of the three or more inputs are adjacent the top surface of the ferroelectric layer, wherein the output is adjacent the top surface of the ferroelectric layer.

4. The die of claim 1, wherein the output comprises:

a source;

a channel; and a drain, wherein the polarization of the ferroelectric layer near the output controls conductivity of the channel.

5. The die of claim 1, further comprising:

a ferromagnetic layer adjacent the ferroelectric layer, wherein the ferroelectric layer is magnetoelectric, wherein individual inputs of the three or more inputs, when a voltage is applied, induces a magnetization in the ferroelectric layer based on the applied voltage;

a spin-orbit coupling stack layer coupled to the ferromagnetic layer; and electrodes coupled to the ferromagnetic layer and the spin-orbit coupling stack layer to pass current through the ferromagnetic layer and the spin-orbit coupling stack layer, wherein the output is adjacent to the spin-orbit coupling stack layer, wherein the current, when passed through the ferromagnetic layer, becomes spin polarized, wherein the spin polarized current, when passed through the spin-orbit coupling stack, induces a voltage on the output.

6. The die of claim 5, further comprising a clock to control current through the electrodes.

7. The die of claim 5, further comprising a spin injection layer between the ferromagnetic layer and the spin-orbit coupling stack, wherein the spin injection layer is adjacent to the ferromagnetic layer, wherein the spin-orbit coupling stack is adjacent to the spin injection layer.

8. The die of claim 5, wherein the spin-orbit coupling stack is adjacent the ferromagnetic layer.

9. The die of claim 5, wherein the ferromagnetic layer comprises cobalt and iron.

10. The die of claim 5, wherein the spin-orbit coupling stack comprises platinum.

11. The die of claim 5, wherein the spin-orbit coupling stack comprises a topological insulator.

12. The die of claim 1, wherein the ferroelectric layer comprises bismuth, iron, and oxygen.

13. A processor comprising the die of claim 1.

14. A die comprising a majority gate, the majority gate comprising:

a magnetoelectric layer;

three or more inputs, wherein individual inputs of the three or more inputs, when a voltage is applied, induces a magnetization in the magnetoelectric layer based on the applied voltage, wherein individual inputs of the three or more inputs are electrically isolated from other inputs of the three or more inputs;

a ferromagnetic layer coupled to the magnetoelectric layer, wherein the magnetization in the magnetoelectric layer controls a magnetic field in the ferromagnetic layer;

a spin-orbit coupling stack layer coupled to the ferromagnetic layer;

electrodes coupled to the ferromagnetic layer and the spin-orbit coupling stack layer to pass current through the ferromagnetic layer and the spin-orbit coupling stack layer; and an output coupled to the spin-orbit coupling stack layer, wherein the current, when passed through the ferromagnetic layer, becomes spin polarized, wherein the spin polarized current, when passed through the spin-orbit coupling stack, induces a voltage on the output.

15. The die of claim 14, further comprising a clock to control current through the electrodes.

16. The die of claim 14, further comprising a spin injection layer between the ferromagnetic layer and the spin-orbit coupling stack, wherein the spin injection layer is adjacent to the ferromagnetic layer, wherein the spin-orbit coupling stack is adjacent to the spin injection layer.

17. The die of claim 14, wherein the spin-orbit coupling stack is adjacent the ferromagnetic layer.

18. A processor comprising the die of claim 14.

19. A die comprising:

three or more inputs, wherein individual inputs of the three or more inputs are electrically isolated from other inputs of the three or more inputs;

an output; and means for creating a voltage on the output based on a majority of input voltages on the three or more inputs, wherein the means for creating the voltage on the output comprises a ferroelectric layer, wherein individual inputs of the three or more inputs, when a voltage is applied, induces a polarization in the ferroelectric layer based on the applied voltage, wherein a voltage on the output depends on a polarization of the ferroelectric layer, wherein the means for creating the voltage on the output comprises:

a ferromagnetic layer adjacent the ferroelectric layer, wherein the ferroelectric layer is magnetoelectric, wherein individual inputs of the three or more inputs, when a voltage is applied, induces a magnetization in the ferroelectric layer based on the applied voltage;

a spin-orbit coupling stack layer coupled to the ferromagnetic layer; and electrodes coupled to the ferromagnetic layer and the spin-orbit coupling stack layer to pass current through the ferromagnetic layer and the spin-orbit coupling stack layer, wherein the output is adjacent to the spin-orbit coupling stack layer, wherein the current, when passed through the ferromagnetic layer, becomes spins polarized, wherein the spin polarized current, when passed through the spin-orbit coupling stack, induces a voltage on the output.

20. The die of claim 19, wherein the output depends on a polarization of the ferroelectric layer near the output, wherein the polarization of the ferroelectric layer near the output is in the same direction as a polarization of the ferroelectric layer near a majority of the three or more inputs.

21. The die of claim 19, wherein the ferroelectric layer comprises a top surface, wherein individual inputs of the three or more inputs are adjacent the top surface of the ferroelectric layer, wherein the output is adjacent the top surface of the ferroelectric layer.

22. The die of claim 19, wherein the output comprises:

a source;

a channel; and a drain, wherein the polarization of the ferroelectric layer near the output controls conductivity of the channel.

23. A processor comprising the die of claim 19.

* * * * *